United States Patent [19]
Roebuck et al.

[11] Patent Number: 5,571,027
[45] Date of Patent: Nov. 5, 1996

[54] NON-DESTRUCTIVE INTERCONNECT SYSTEM FOR SEMICONDUCTOR DEVICES

[75] Inventors: Randal D. Roebuck, Dallas, Tex.; Salvatore P. Rizzo, Norwood, Mass.

[73] Assignee: Texas Instruments Incorporated, Dallas, Tex.

[21] Appl. No.: 547,538

[22] Filed: Oct. 24, 1995

Related U.S. Application Data

[63] Continuation of Ser. No. 375,863, Jan. 20, 1995, Pat. No. 5,468,158, which is a continuation of Ser. No. 146,726, Oct. 29, 1993, Pat. No. 5,397,245.

[51] Int. Cl.⁶ .................................................. H01R 13/15
[52] U.S. Cl. ................................................... 439/264
[58] Field of Search ............................ 439/55, 68–73, 439/263–266, 331, 525, 526; 324/72.5, 149

[56] References Cited

U.S. PATENT DOCUMENTS

| | | | |
|---|---|---|---|
| 4,684,184 | 8/1987 | Grabbe et al. | 439/71 |
| 4,832,612 | 5/1989 | Grabbe et al. | 439/71 |
| 4,846,703 | 7/1989 | Matsuoka et al. | 439/71 |
| 5,127,837 | 7/1992 | Shah et al. | 439/71 |
| 5,180,976 | 1/1993 | Van Loan et al. | 324/158 F |
| 5,397,245 | 3/1995 | Roebuck et al. | 439/264 |

*Primary Examiner*—Khiem Nguyen
*Attorney, Agent, or Firm*—W. James Brady, III; Richard L. Donaldson

[57] ABSTRACT

An interconnect system (8') for providing electrical connection to bond pads on a semiconductor device (21) includes a socket (12) having a plurality of conductors (46) and a carrier assembly (40) mounted on the socket (12) for carrying a semiconductor device (21). The carrier assembly (40) includes a substrate (17) having a compliant membrane (20b) and a plurality of contact bumps (24) on a top surface of the compliant membrane (20b) for contacting bond pads on the semiconductor device (21) and a force applying mechanism (63). Compliant membrane (20b) is part of a thin film interconnect (20). Contact bumps (24) are connected electrically with conductors (46) by conductive traces (19) and contact pads (18) formed on the thin film interconnect (20). The force applying mechanism (63') applies pressure in making temporary electrical connection between contact bumps (24) and the bond pads of semiconductor device (21). The interconnection system (8') provides non-destructive interconnection to semiconductor device (21).

5 Claims, 8 Drawing Sheets

NON-DESTRUCTIVE INTERCONNECT SYSTEM FOR SEMICONDUCTOR DEVICES

CROSS-REFERENCE TO RELATED APPLICATIONS

This is a continuation of application Ser. No. 08/375,863, filed Jan. 20, 1995, now U.S. Pat. No. 5,468,150, which is a continuation of application Ser. No. 08/146,726 filed Oct. 29, 1993, now U.S. Pat. No. 5,397,245.

The following coassigned patent application is hereby incorporated herein by reference:

| Patent No. | Issue Date | TI Case No. |
|---|---|---|
| 5,123,850 | 06/23/92 | 14457A |
| 5,225,037 | 07/06/93 | 16087 |

FIELD OF THE INVENTION

This invention relates to semiconductor devices and, more particularly, to a non-destructive interconnect system for semiconductor devices.

BACKGROUND OF THE INVENTION

The semiconductor industry is entering a new phase of packaging density with the development of electronic modules containing multiple integrated circuit (IC) die. Recent increases in semiconductor device clock speeds, the number of inputs and outputs, die densities, and pad densities have made it desirable to package a variety of different integrated circuits, such as microprocessors, ASIC devices, and memory devices, together into multi-chip modules (MCM) and hybrids to create high performance products.

A factor identified by the industry as critical to the successful development of multi-chip modules is the availability of "known good die" (KGD). A known good die is a die in which there is a very high confidence level that it will operate reliably over its intended lifetime. With many die mounted into a multi-chip module, the compound effect of the individual yields of the different die becomes an issue. For example, twenty die assembled into a multi-chip module (MCM) having individual yields of 95% will produce an MCM first pass test yield of only 35%. Such a low yield will result in an undesirable quantity of material scrap and require very expensive and labor intensive rework. The use of known good die is required to achieve optimal first pass test yields in producing multi-chip modules in either a chips first or chips last assembly approach.

Since semiconductor die exhibit early life failures when tested across time, "burn-in" testing at elevated temperatures is used to identify potentially defective die and separate them from the remaining known good die. The potentially defective die are discarded and only the remaining known good die are placed in their final packaging configuration. One current test method uses mechanical probe needles at wafer level probe. A drawback to this method is that the mechanical probe needles have limited density capability and leave considerable damage in the form of impressions on the bond pad. These impressions are unacceptable in the chips "first" MCM assembly approach. Another current test method uses TAB (tape automated bonding) tape at die level test. A drawback to this method is that TAB tape in higher density configurations is costly and requires circuit area for application to a packaging scheme. In addition, the availability of TAB tape is limited at present.

Currently, the most widely used method in obtaining known good die (KGD) is packaging the die, testing the die in the package, and removing the die from the package. The extra material and processing required by this method make this form of testing very expensive. In addition, this temporary packaging method reduces integrated circuit density since it requires the die to have extra or enlarged pads for wire bonding to connect the signal leads of the package. This method of testing also has an adverse affect on die reliability due to the fact that after removing the die from the test package, the bond wires are broken off before the die is assembled into the final package configuration. Removal of the bond wires tends to damage the bond pads on the device, resulting in lower yielding bonds.

In light of present test methods, manufacturers must currently decide between assembling multi-chip modules or hybrids with pre-tested, but damaged semiconductor die or die which have not been tested or conditioned.

Accordingly, a need exists for an interconnect system that can be used to test semiconductor die or wafers without damaging them.

DETAILED DESCRIPTION OF PREFERRED EMBODIMENTS

Figure 1:
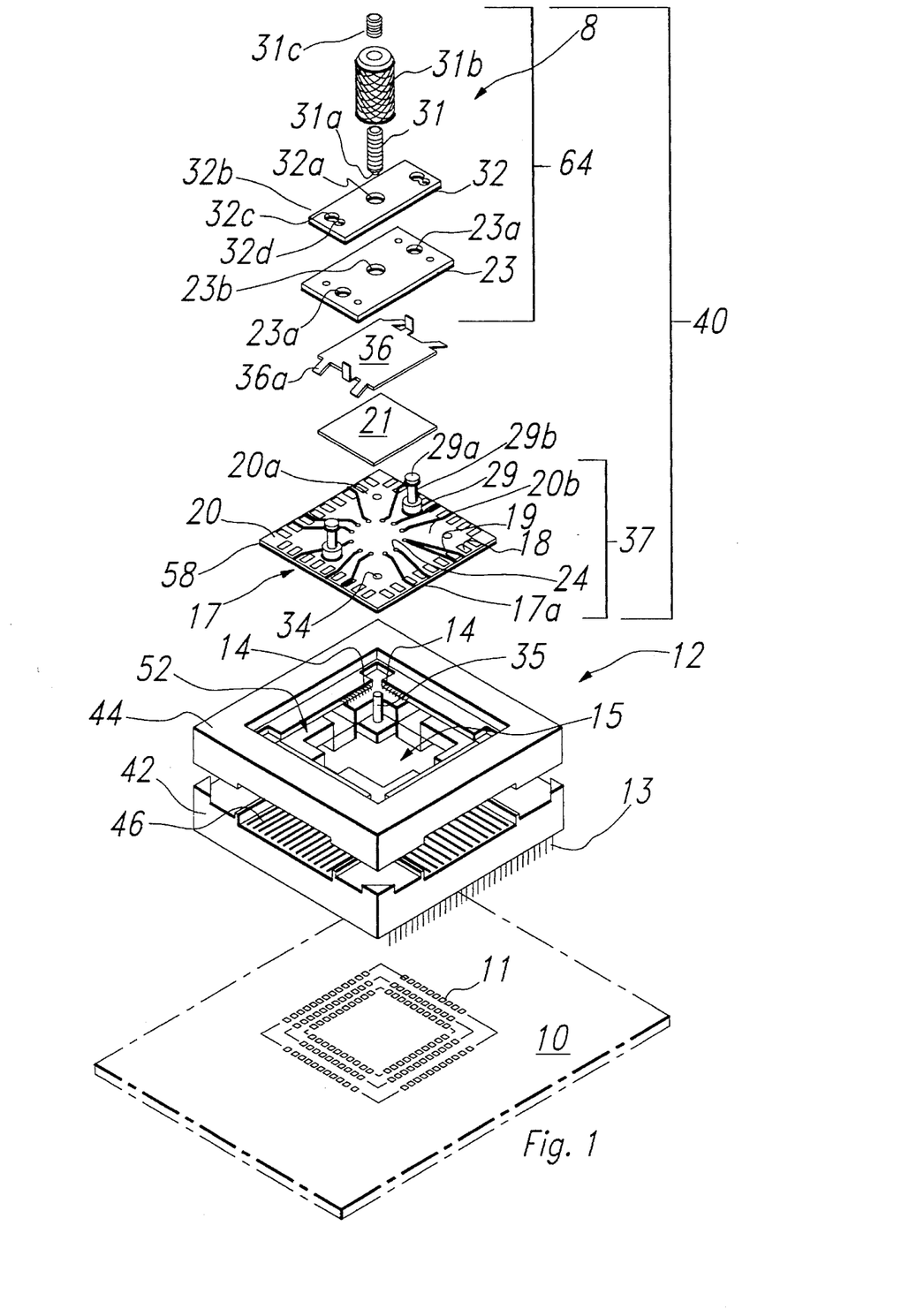
FIG. 1 is an exploded perspective view of a test interconnect system according to one embodiment of the present invention.

FIG. 1 is an exploded perspective view of a die level burn-in test interconnect system 8 according to one embodiment of the present invention. Burn-in test interconnect system 8 is used in conventional burn-in ovens and is non-destructive in that it allows semiconductor die to be thoroughly tested and conditioned without damaging the bonding pads or surface passivation of the die. Burn-in test interconnect system 8 includes a burn-in test board 10, a socket 12 for mounting on burn-in test board 10, and a die carrier assembly 40 for insertion into socket 12 that serves as temporary package for semiconductor die.

Burn-in test board 10 is connected to burn-in test equipment (not illustrated) used to test semiconductor die. Burn-in test board 10 is a printed wire board having conductive traces (not shown) that are connected to a plurality of plated through-holes 11 on burn-on test board 10 for supplying signals between a semiconductor die to be tested and the burn-in test equipment.

Socket 12 of burn-in interconnect system 8 can be mounted on burn-in test board 10 and can receive and securely hold a die carrier assembly 40 containing a die 21 to be tested. Socket 12 includes a base 42, cover 44, and a plurality of electrical conductors 46. Each conductor 46 terminates in an electrical connector pin 13 extending from the bottom of base 42 that can be inserted into a corresponding plated through-hole 11 to electrically connect socket 12 to burn-in test board 10. Socket 12 is mounted on burn-in test board 10 to test die 21 by inserting pins 13 into corresponding plated through-holes 11 in burn-in test board 10.

Each conductor 46 also includes a pad contact portion 14 for selectively contacting and holding die carrier assembly 40 in socket 12. Contact portions 14 define an opening 52 directly above base 42. The application of pressure to force cover 44 towards base 42 biases contact portions 14 of conductors 46 causing them to retract toward the edges of base 42 to increase the dimensions of opening 52. The relative dimensions of substrate 17 of die carrier assembly 40 and opening 52 are such that substrate 17 is able to pass through the opening 52 only when cover 44 is forced towards base 42 to retract pad contact portions 14.

Die carrier assembly 40 is inserted into socket 12 by forcing cover 44 towards base 42 to bias contact portions 14 to increase the size of opening 52. Die carrier assembly 40 is then placed through opening 52 and onto the top surface of base 42. When the force on cover 44 is released, contact portions 14 return to their original positions where they extend over and are in contact with pads 18 on substrate 17 to securely hold die carrier assembly 40 against the top surface of base 42.

Die carrier assembly 40 includes a substrate assembly 37 on which a die 21 to be tested is placed and which distributes signals from die 21 under test to test equipment via conductors 46 in socket 12 and conductive traces in burn-in test board 10. Die carrier assembly also includes a latch assembly or force applying mechanism 64 including a lid 23, latch 32, pressure screw 31, threaded coupling 31b, and plug screw 31c for securing die 21 to substrate assembly 37. Latch assembly mechanism 64 can be manually adjusted to apply different amounts of force to die 21. Die carrier assembly 40 may also include an optional biasing clip 36 for providing backside ground or power bias to die 21 if die 21 requires backside ground or power bias.

Substrate assembly 37 includes a substrate 17 having a base 17a of metal, for example, with a thin film interconnect 20 formed over the top surface of base 17a. Thin film interconnect 20 may include a single layer 20a of a polymer dielectric film, such as polyimide, on which conductive signal traces 19 are formed. Alternatively, thin film interconnect 20 may include a plurality of layers 20a of a thin film polymer dielectric film with conductive signal traces 19 formed on each layer 20a as described in U.S. Pat. No. 5,123,850. An opening 17b (see FIG. 5) is etched through base 17a from the bottom to produce a membrane 20b in a portion of thin film interconnect 20.

Alignment holes 34 extend through base 17a and thin film interconnect 20 for receiving alignment pins 35 extending from base 42. Alignment pins 35 and holes 34 permit die carrier assembly 40 to be inserted into socket 12 in only a single orientation thus insuring that test signals supplied via test board 10 are coupled to the correct bond pads on die 21. Other mechanical or optical alignment techniques could be used instead of holes 34 and pins 35 to align die carrier assembly 40 on base 42 of socket 12.

Substrate 17 also includes a plurality of conductive pads 18 formed on the top surface of thin film interconnect 20 and electrically connected to associated signal traces 19. Pads 18 are formed around the periphery of thin film interconnect 20 so that each pad 18 contacts an associated one of the pad contact portions 14 of a conductor 46 when die carrier assembly 40 is inserted into socket 12, as hereinafter described.

Substrate 17 also includes a plurality of conductive contact bumps 24 formed of gold or copper, for example, on the top surface of thin film interconnect 20 and electrically connected to associated signal traces 19 for probing or contacting the bond pads of die 21. Bumps 24 are durable and provide electrical connection between the bumps 24 and the bond pads of die 21 when die 21 is mounted in die carrier assembly 40. Bumps 24 are formed toward the center of thin film interconnect 20 and are surrounded by pads 18. Bumps 24 are arranged in a pattern so as to contact associated bond pads 21a (see FIG. 3) on the bottom surface of die 21. Signal traces 19 on thin film interconnect 20 electrically connect each bump 24 to an associated pad 18. The materials for film layers 20a and base 17a are chosen with coefficients of thermal expansion properties that allows conductive contact bumps 24 formed on the surface of thin film interconnect 20 to retain registration to the bond pads 21a (see FIG. 3) of die 21 in both cold and hot conditions.

Conventional vision positioning equipment (not shown) would place and align the die 21 on the substrate 17 of die carrier assembly 40 using well-known optical recognition techniques. Optical alignment marks 58 are provided on substrate 17 for this purpose.

Lid 23, latch 32 and pressure screw 31 of die carrier assembly 40 cooperate to apply pressure to and securely hold die 21 during testing. Lid 23 has holes 23a and a recessed portion 23b. Lid 23 is formed from a material that is rigid and preferably also thermally conductive, such as aluminum, so that lid 23 will act as a heat sink to dissipate heat generated by die 21 during testing. Lid 23 may be provided with fins or fingers (not shown) to more efficiently dissipate heat if necessary. After die 21 is placed on the substrate 17, lid 23 is placed over and in contact with die 21 with posts 29 extending through openings 23a.

Latch 32 is formed from a rigid material, such as aluminum or stainless steel, and has a threaded hole 32a and locking holes 32b. Holes 32b have first and second portions 32c and 32d, respectively. Portions 32c are large enough to permit heads 29a of posts 29 to pass through. Portions 32d are not large enough to permit heads 29a of posts 29 to pass through but are large enough to accept shaft portions 29b of posts 29. Threaded hole 32a receives pressure screw 31 which has a spring biased tip 31a.

After lid 23 is placed in contact with die 21, latch 32 is placed over lid 23 with portions 32c of holes 32b aligned with posts 29 and spring biased tip 31a aligned with recessed portion 23b of lid 23. Latch 32 is then forced towards lid 23 by compressing spring biased tip 31a until heads 29a of posts 29 are above latch 32. Latch 32 is then rotated so that shafts 29b of posts 29 are received in hole portions 32d of holes 32a. Spring biased tip 31a forces the top surface of latch 32 against heads 29a of posts 29 to lock latch 32 in place. Spring biased tip 31a also forces lid 23 against die 21 to apply pressure to and securely hold die 21 in place. Spring biased tip 31a allows for variations in die thickness. Threaded coupling 31b can be screwed over pressure screw 31 to contact latch 32 and threaded plug 31c screwed into coupling 31b to prevent movement of pressure screw 31.

For semiconductor die that require backside ground or power biasing, die carrier assembly 40 may also be provided with a biasing clip 36. Biasing clip 36 is formed from a conductive material, such as aluminum, and is sandwiched between lid 23 and the backside of die 21. Biasing clip 36 has conductive tabs 36a that contact those signal traces 19 on thin film interconnect 20 that supply Power or ground to provide backside ground or power biasing for semiconductor die 21.

Figure 2:
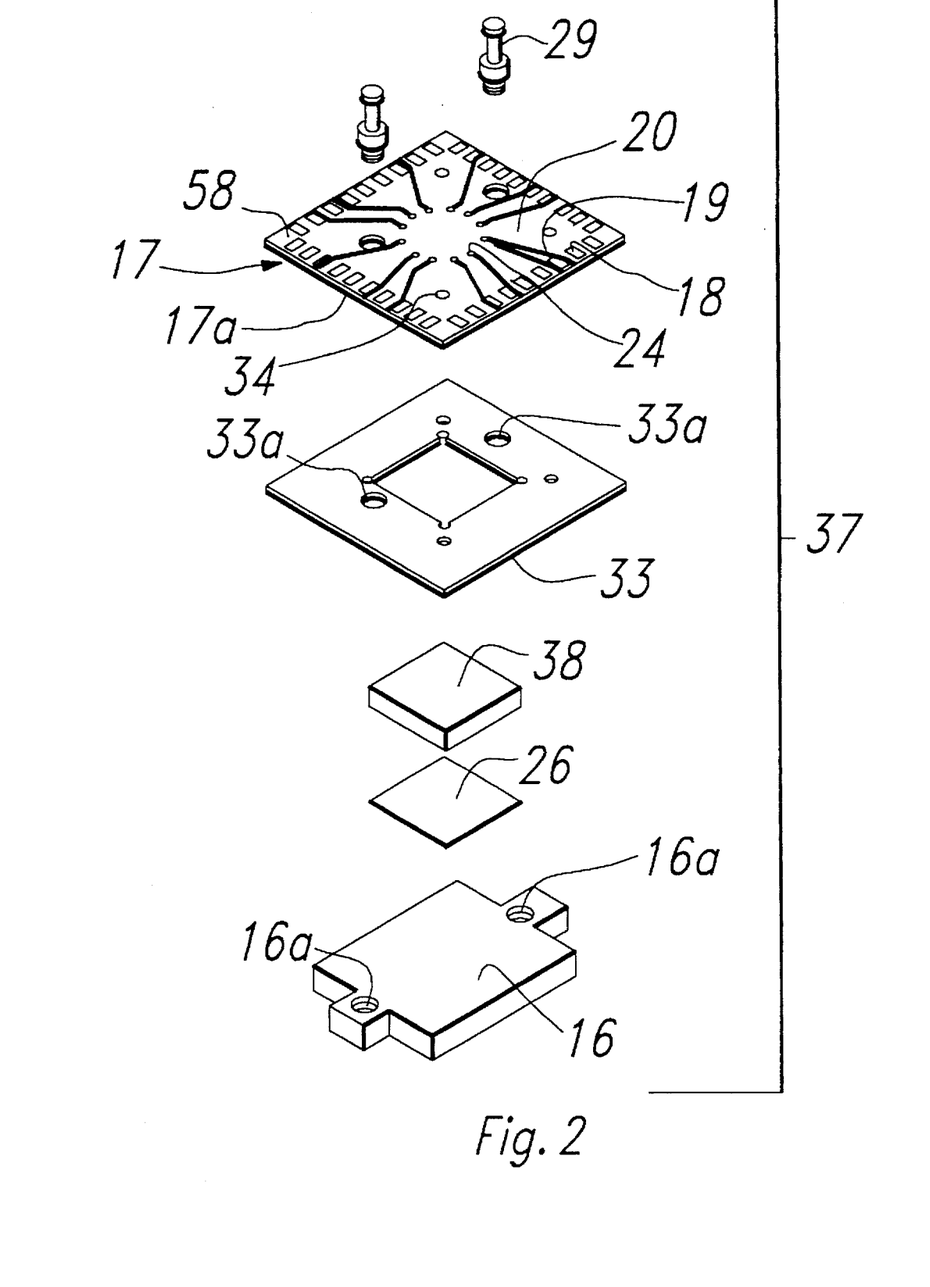
FIG. 2 is an exploded perspective view of the substrate assembly in the test interconnect system of FIG. 1.

FIG. 2 is an exploded perspective view of substrate assembly 37. As discussed above with respect to FIG. 1, substrate assembly 37 includes posts 29 and a substrate 17 having a base 17a, a thin film interconnect 20 having signal traces 19 covering the top surface of base 17a, a plurality of conductive pads 18, a plurality of conductive contact bumps 24. Substrate assembly 37 also includes a backplate 16, a flexible member 38 (formed from an elastomer, for example), insert 26, and a backplate spacer 33. Backplate spacer 33 has a thickness that insures that pads 18 are in good electrical contact with contact portions 14 when die carrier assembly 40 is inserted into socket 12.

Backplate 16 is fastened to the bottom surface of substrate 17 by passing posts 29 through holes 17b in substrate 17 and through holes 33a in backplate spacer 33 and then threading posts 29 into threaded holes 16a in backplate 16. Backplate 16 is shaped to mate with cavity 15 of socket 12 when die carrier assembly 40 is inserted into socket 12. Flexible member 38 and insert 26 are supported by backplate 16 and fit into the opening 17b (see FIG. 5) to supply pressure membrane 20b.

Figure 3:
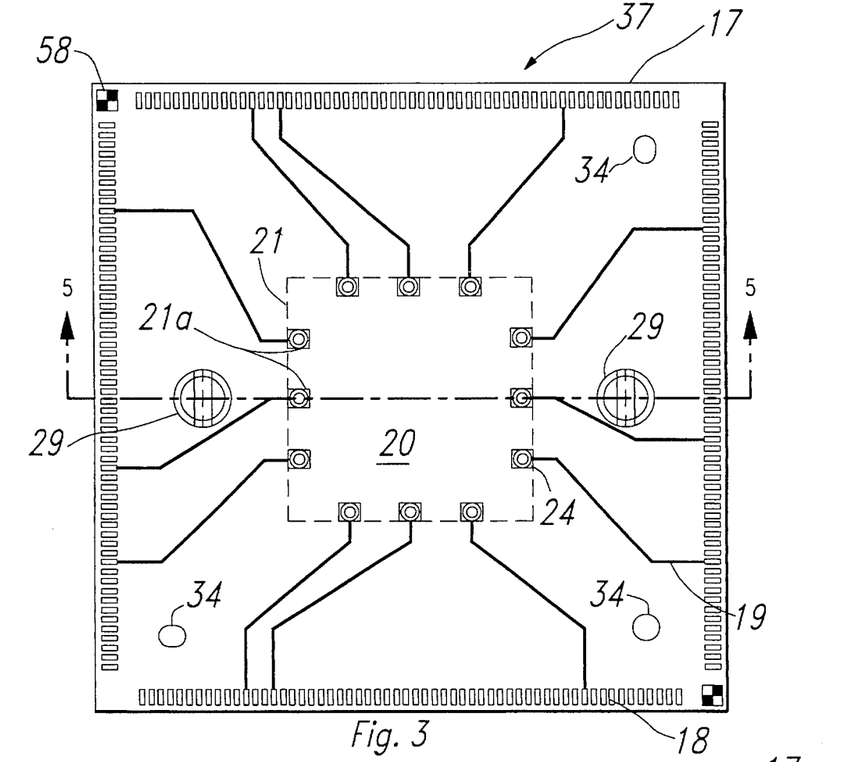
FIG. 3 is a top view of the substrate assembly in the test interconnect system of FIG. 1.
Figure 4:
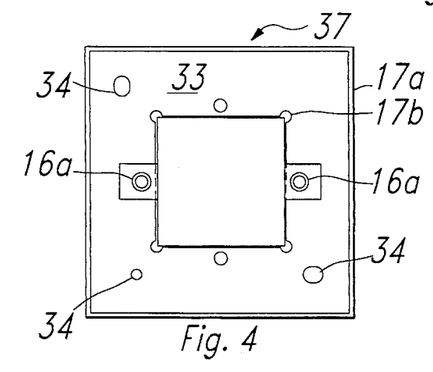
FIG. 4 is a bottom view of the substrate assembly in the test interconnect system of FIG. 1.

FIGS. 3 and 4 are top and bottom view, respectively, of substrate assembly 37. A die 21 having bond pads 21a is shown in phantom in FIG. 3. Although die 21 is shown with standard metallurgical bond pads arranged in a peripheral pad layout, it is understood that die 21 could have other types of bond pads, such as bumped bond pads, and that the bond pads could be arranged differently, such as in an area array.

Figure 5:
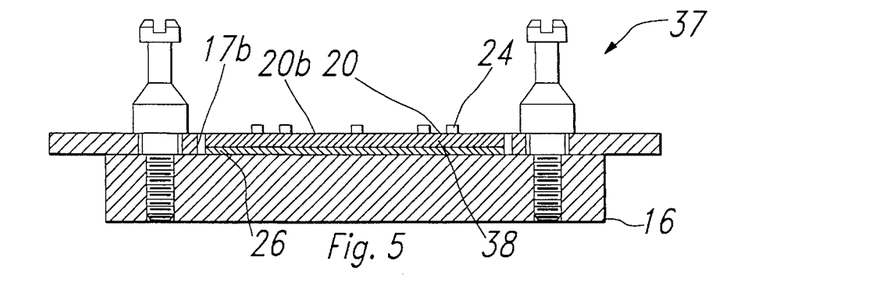
FIG. 5 is a cross-sectional view of the substrate assembly taken along section lines 5—5 of FIG. 3.

FIG. 5 is a cross-sectional view of substrate assembly 37 taken along section lines 5—5 of FIG. 3. As seen in FIG. 5, an opening 17b extends through base 17a. A portion of thin film interconnect 20 extends over opening 17b to form a compliant membrane 20b. Contact bumps 24 are located on compliant membrane 20b of thin film interconnect 20 over opening 17b. Flexible member 38 and insert 26 act as a support means for compliant membrane 20b of thin film interconnect 20 on which contact bumps 24 are formed. The support means formed by flexible member 38 and insert 26 operates to keep the top surfaces of contact bumps 24 substantially planar and thus provide accommodation for variations in height between contact bumps 24. The support means formed by flexible member 38 and insert 26 also operates to help maintain contact bumps 24 and bond pads 21a of die 21 in registration despite variations in temperature.

Where thin film interconnect 20 is formed from a polymer having a low CTE (coefficient of thermal expansion), such as 3–5 ppm (parts per million), and base 17a is formed from aluminum, the resulting circuit CTE (i.e. the CTE of membrane 20b and bumps 24) will approximate the CTE of die 21 when opening 17b is etched through base 17a to produce membrane 20b. In this situation, membrane 20b will be placed in compression causing a bowing of the membrane 20b surface. Planarization of bumps 24 on membrane 20b is accomplished by selecting thicknesses of flexible member 38 and insert 26 such that the surfaces of bumps are in a common plane when die is secured in die carrier assembly 40. Since the CTE of membrane 20b closely matches that of die 21, contact bumps 24 will move with bond pads 21a of die 21 to substantially reduce the x/y scrub when die carrier assembly 40 is subjected to variations in temperature. Insert 26 may be optionally eliminated in this situation by appropriately increasing the thickness of flexible member 38.

Where thin film interconnect 20 is formed from a polymer having a high CTE, such as 40–50 ppm and base 17a is formed from aluminum, the resulting circuit CTE (i.e. the CTE of membrane 20b and bumps 24) will be appreciably higher than the CTE of die 21 when opening 17b is etched through base 17a to produce membrane 20b. As a result, the polymer dielectric film will be placed in tension resulting in a taut membrane 20b. Since membrane 20b has a higher CTE than die 21, contact bumps 24, if unrestrained, will move across or scrub the bond pads 21a of die 21 when die carrier is subjected to variations in temperature. This scrubbing action can damage bond pads 21a. In order to substantially reduce this scrubbing effect, flexible member 38 is adhesively bonded to membrane 20b and to insert 26. Insert 26 is formed from a material having a CTE similar to that of die 21 and thus serves as a restraining mechanism for flexible member 38 and membrane 20b. As a result, the scrubbing action between contact bumps 24 and bond pads 21a of die 21 is substantially reduced. Insert 26 may be formed from alumina, silicon, or a low CTE metal, for example. Insert 26 may also be optionally eliminated in this situation by appropriately increasing the thickness of flexible member 38 and adhesively bonding flexible member to backplate 16. Backplate 16, in this instance, is also formed from a material having a CTE similar to that of die 21.

Figure 6:
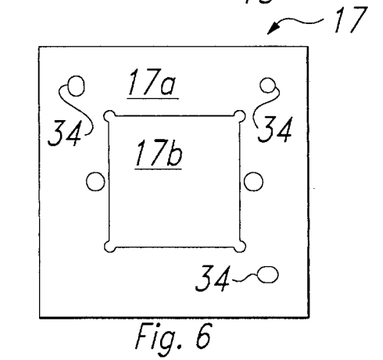
FIG. 6 is a bottom view of the substrate in the test interconnect system of FIG. 1.

FIG. 6 is a bottom view of substrate 17 showing the location of opening 17b.

Figure 7:
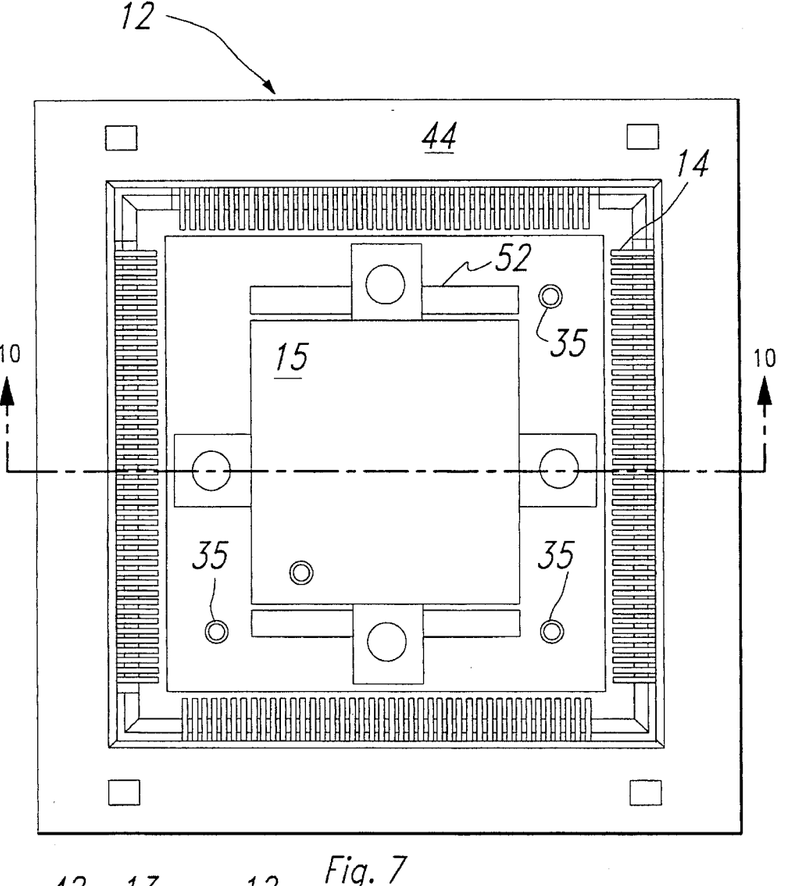
FIG. 7 is a top view of the socket in the test interconnect system of FIG. 1 in its normal non-load die carrier assembly position.
Figure 8:
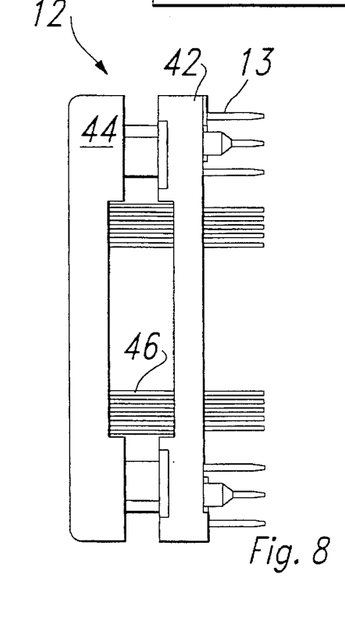
FIG. 8 is a side view of the socket of FIG. 7.
Figure 9:
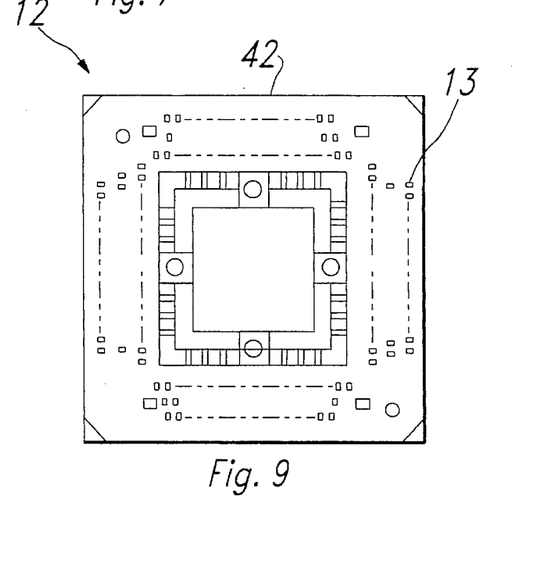
FIG. 9 is a bottom view of the socket of FIG. 7.
Figure 10:
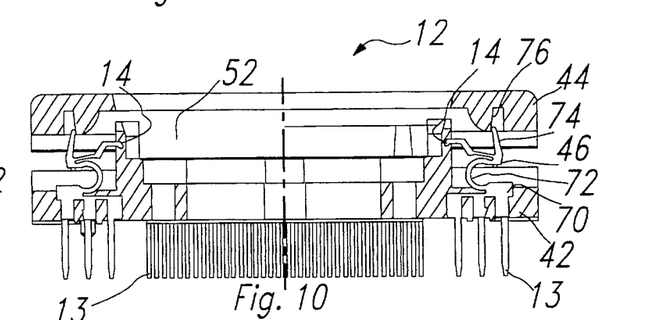
FIG. 10 is a cross-sectional view of the socket of FIG. 7 taken along section lines 10—10.

FIGS. 7, 8, and 9 are top, side, and bottom views, respectively, of socket 12 when cover 44 is not being forced toward base 42 and die carrier assembly 40 is not inserted into socket 12. FIG. 10 is a cross-sectional view of socket 12 taken along section lines 10—10 of FIG. 7. As seen in FIG. 10, each conductor 46 includes three pins 13 that are connected to body portion 70 which is rigidly mounted in base 42. Each conductor also includes a curved portion 72 which is connected to biasing portion 74 which, in turn, is connected to contact portion 14. Cover 44 includes biasing surface 76 which is angled so as to force biasing portion 74 to bend away from opening 52 when cover 44 is moved toward base 42. Since contact portion 14 is attached to biasing portion 74, when biasing portion 74 is bent by biasing surface 76, contact portion 14 is retracted by moving upwardly and outwardly thus increasing the size of opening 52.

Figure 11:
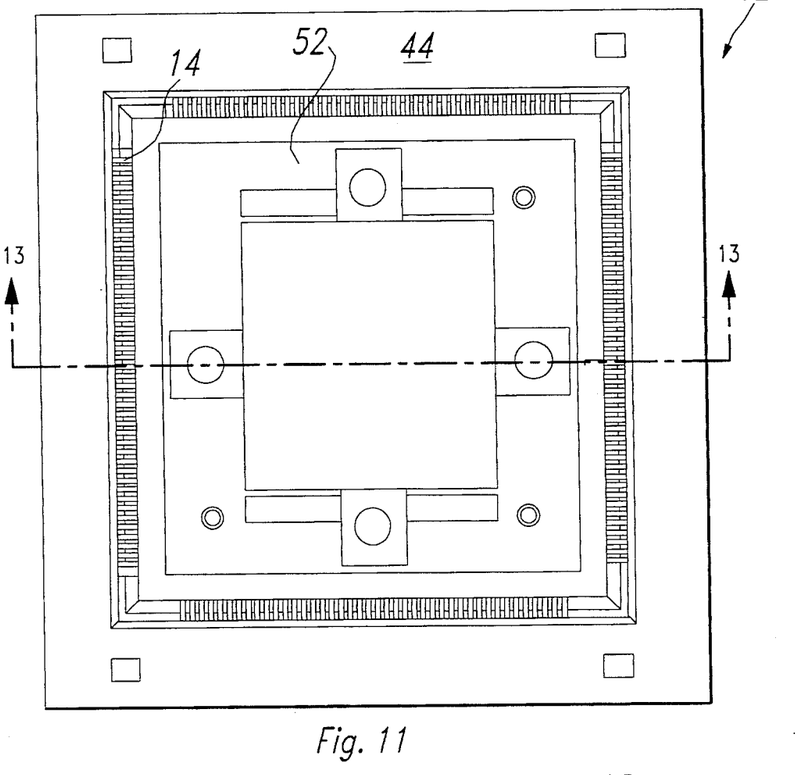
FIG. 11 is a top view of the socket in the test interconnect system of FIG. 1 in its load die carrier assembly position.
Figure 12:
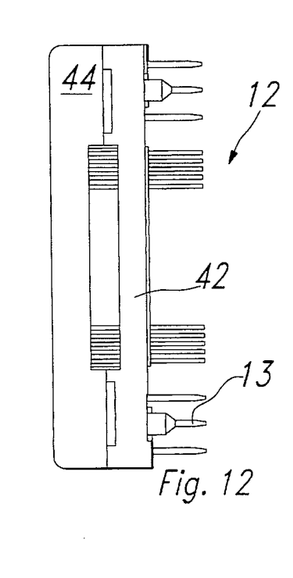
FIG. 12 is a side view of the socket of FIG. 11.
Figure 13:
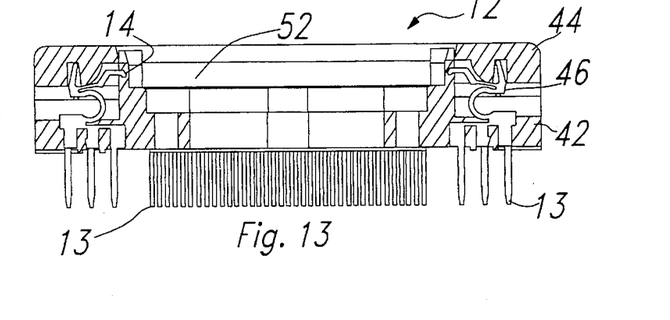
FIG. 13 is a cross-sectional view of the socket of FIG. 11 taken along section lines 13—13.

FIGS. 11 and 12 are top and side views, respectively, of socket 12 when cover 44 is being forced toward base 42 to permit die carrier assembly 40 to be inserted into socket 12. FIG. 13 is a cross-sectional view of socket 12 taken along section lines 13—13 of FIG. 11.

As can be seen by comparing FIGS. 7 and 11, opening 52, defined by contact portions 14, increases in size when cover 44 is forced toward base 42. As can be seen by comparing FIGS. 10 and 13, contact portions 14 are forced upward and outward when cover 44 is forced toward base 42 to increase the size of opening 52.

Figure 14:
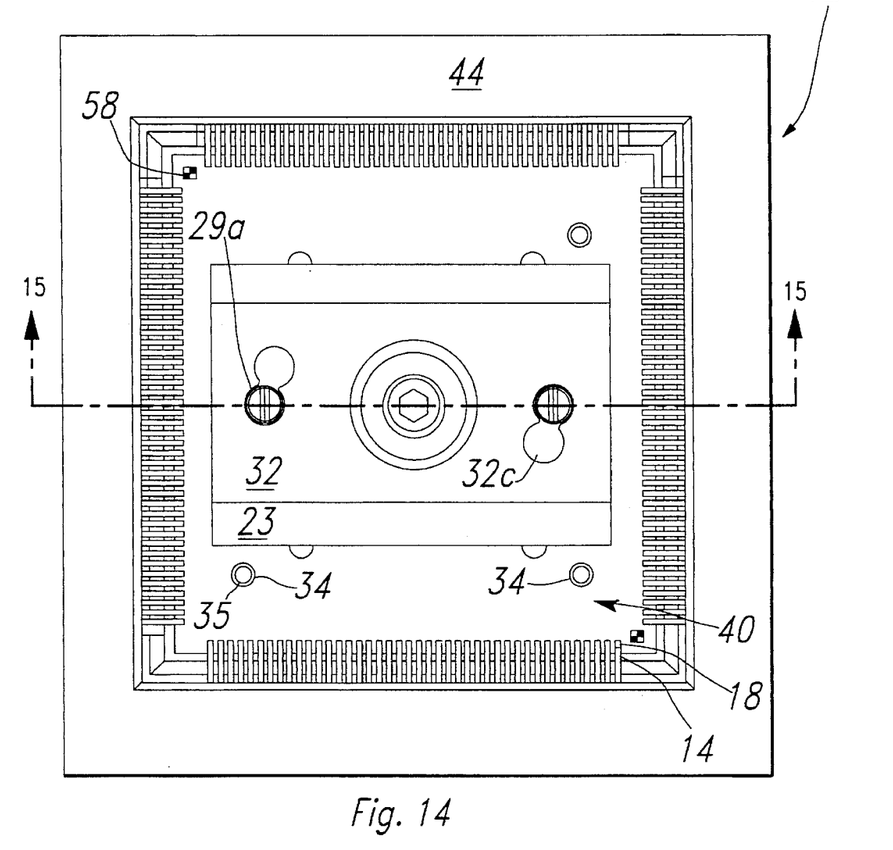
FIG. 14 is a top view of the die carrier assembly in the test interconnect system of FIG. 1.

FIG. 14 is a top view of socket 12 in which die carrier assembly 40 has been inserted. As can be seen in FIG. 14, contact portions 14 of conductors 46 extend over and are in contact with pads 18 to hold die carrier assembly 40 in socket 12 and provide electrical continuity between die carrier assembly 40 and socket 12.

Figure 15:
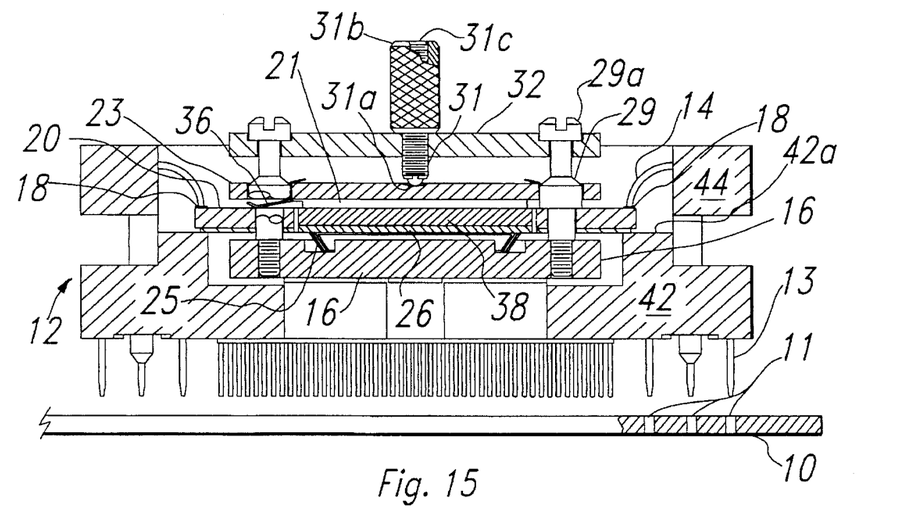
FIG. 15 is a cross-sectional view of the die carrier assembly of FIG. 14 taken along section lines 15—15.

FIG. 15 is a cross-sectional view of socket 12 and die carrier 40 taken along section lines 15—15 of FIG. 14. As seen in FIG. 15, when die carrier 40 is inserted into socket 12, contact portions 14 of conductors 46 are in contact with pads 18 on thin film interconnect 20 and securely hold substrate 17 against top surface 42a of base 42.

The support means formed by flexible member 38 and insert 26 allow contact bumps 24 to be maintained in a common plane. Spring loaded tip 31a of pressure screw 31 forces lid 23 against the top surface of die 21 and forces latch 32 against heads 29a of posts 29 to securely hold die 21. The coefficient of thermal expansion mismatch between die 21 and substrate assembly 37 provide a non-destructive scrubbing action that penetrates the thin oxide layer that is typically found on bond pads 21a and provides good electrical contact between the contact bumps 24 and bond pads 21a on the semiconductor die 21.

Figures 16, 17A, 17B, 17C, 17D:
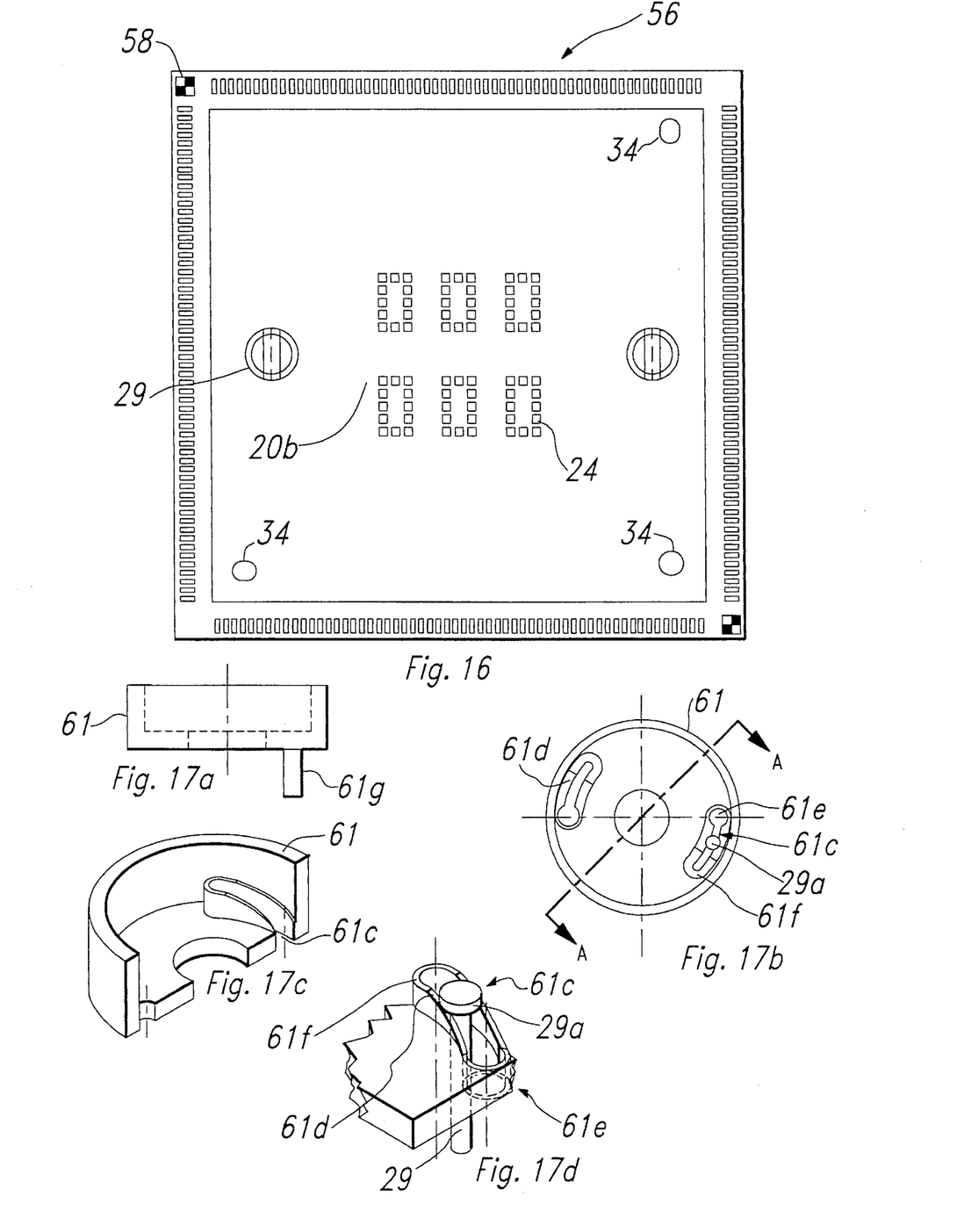
FIG. 16 is a top view of a substrate assembly according to a second embodiment of the invention.
FIG. 17a is a side view of latch 61 of FIG. 17.
FIG. 17b is a top view of latch 61 of FIG. 17.
FIG. 17c is a cross-section of latch 61 taken along section lines A—A of FIG. 17b.
FIG. 17d is an enlarged view of a ramp 61c of FIG. 17c.

FIG. 16 shows a top view of a substrate assembly 56 according to another embodiment of the invention. Substrate assembly 56 is similar to substrate assembly 37 of FIG. 5 but instead of supporting a single semiconductor die, substrate assembly 56 supports a wafer containing a plurality of die. Contact bumps 24 are arranged in groups with each group being associated with the bond pads of a single die in the wafer. Compliant membrane 20b is supported by flexible member 38 as in FIG. 16.

Figure 17:
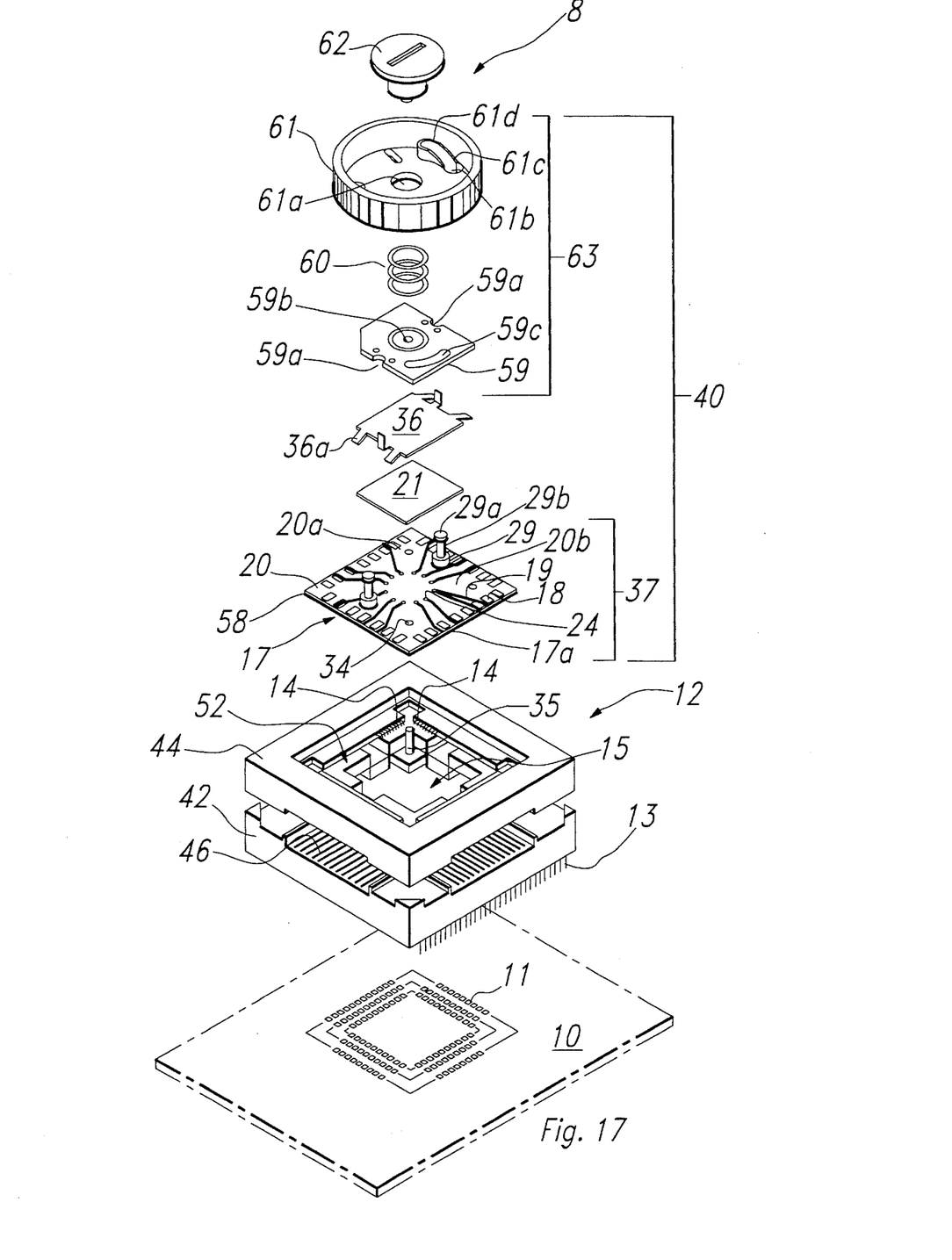
FIG. 17 is an exploded perspective view of a test interconnect system according to a third embodiment of the present invention.

FIG. 17 shows an exploded perspective view of a test interconnect system 8' according to a third embodiment of the present invention. Test interconnect system 8' is identical to system 8 with the exception that a rotary latch assembly or force applying mechanism 63 is used in place of latch assembly or force applying mechanism 64 of FIG. 1. Rotary latch assembly or force applying mechanism 63 includes rotary latch 61, center post 62, spring 60, and lid 59. Mechanism 63 provides automated or hand assembly capability. A pair of ramps 61c are integral with rotary latch 61 and provide a gradual increase in force applied through preloaded spring 60 to lid 59 and therefore to die 21. As seen in FIG. 17b, ramps 61c have openings 61e through which heads 29a of posts 29 are inserted and openings 61f which receive shafts 29b of posts 29 when latch 61 is rotated. Force is applied to lid 59 by rotating latch 61 so that heads 29a move up ramps 61c as shown in phantom in FIG. 17a. Detents 61d on the ends of ramps 61c of rotary latch 61 receive heads 29a of posts 29 to provide a locking mechanism. Post holes 59a in lid 59 with rotary latch 61 mate with posts 29 of substrate assembly 37. Latch 61 has a downwardly extending leg 61g (see FIG. 17a) that mates with recessed slot 59c in the top surface of lid 59 to limit the extent to which latch 61 may be rotated and allows the latch assembly 63 to be in either the open, transitional, or closed position. Center post 62 screws into threaded opening 59b of lid 59.

A few preferred embodiments have been described in detail hereinabove. It is to be understood that the scope of the invention also comprehends embodiments different from those described, yet within the scope of the claims. For example, test interconnect system 8 may be used to perform tests other than burn-in tests and may be used to provide electrical connection to a semiconductor device to permit operation of the semiconductor device in modes other than a test mode.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A carrier assembly for carrying a semiconductor device, comprising:

a base;

a thin film interconnect extending over a top surface of said base;

a plurality of contact bumps on a top surface of said thin film interconnect for contacting bond pads on the semiconductor device;

a pair of posts extending from said base, each of said posts having a shaft having a first lateral dimension and a head having a second lateral dimension greater than said first lateral dimension;

a lid positioned over said base;

a rotary latch positioned over said lid, said rotary latch having a pair of openings through which said posts extend, each of said openings having a first portion in a first surface of said rotary latch and a second portion in a second surface of said rotary latch, said first and second surfaces being spaced vertically apart;

a spring positioned between said lid and said rotary latch, said rotary latch applying force to said lid through said spring, whereby rotation of said rotary latch moves said heads from said first portion to said second portion to increase the force applied by said rotary latch to said lid through said spring.

2. The carrier assembly of claim 1 further comprising:

signal traces on said top surface of said thin film interconnect electrically connected to said contact bumps;

a conductive clip between a top surface of the semiconductor device and said lid for contacting said signal traces and the top surface of the semiconductor device for electrically biasing the semiconductor device.

3. The carrier assembly of claim 1 in which said lid has a pair of openings through which said shafts of said posts extend.

4. The carrier assembly of claim 1 in which said first portion is larger than the head of an associated one of said posts and said second portion is smaller than the head of the associated one of said posts.

5. The carrier assembly of claim 1 in which each of said openings has a third portion between said first and second portions, said third portion in a surface extending between said first surface and said second surface.

* * * * *